(12) United States Patent
Hutchinson

(10) Patent No.: US 12,235,338 B2
(45) Date of Patent: Feb. 25, 2025

(54) ULTRAFAST MRI SYSTEM AND METHOD

(71) Applicant: Michael Hutchinson, New York, NY (US)

(72) Inventor: Michael Hutchinson, New York, NY (US)

( * ) Notice: Subject to any disclaimer, the term of this patent is extended or adjusted under 35 U.S.C. 154(b) by 151 days.

(21) Appl. No.: 18/200,229

(22) Filed: May 22, 2023

(65) Prior Publication Data

US 2024/0210505 A1 Jun. 27, 2024

Related U.S. Application Data

(60) Provisional application No. 63/434,790, filed on Dec. 22, 2022.

(51) Int. Cl.
| | | |
|---|---|---|
| *G01R 33/44* | (2006.01) | |
| *G01R 33/36* | (2006.01) | |
| *G01R 33/385* | (2006.01) | |
| *G01R 33/483* | (2006.01) | |
| *G01R 33/56* | (2006.01) | |
| *G01R 33/561* | (2006.01) | |

(52) U.S. Cl.
CPC ....... *G01R 33/445* (2013.01); *G01R 33/3607* (2013.01); *G01R 33/385* (2013.01); *G01R 33/4835* (2013.01); *G01R 33/5617* (2013.01); *G01R 33/5608* (2013.01)

(58) Field of Classification Search
CPC .............. G01R 33/3607; G01R 33/385; G01R 33/445; G01R 33/4835; G01R 33/5608; G01R 33/5617

See application file for complete search history.

(56) References Cited

U.S. PATENT DOCUMENTS

| | | | |
|---|---|---|---|
| 9,474,454 B2* | 10/2016 | Feinberg ............ | G01R 33/4835 |
| 11,385,312 B2* | 7/2022 | Hutchinson ........ | G01R 33/5611 |
| 2022/0283251 A1* | 9/2022 | Mickevicius ...... | G01R 33/5615 |

* cited by examiner

*Primary Examiner* — Gregory H Curran
(74) *Attorney, Agent, or Firm* — Wissing Miller LLP

(57) ABSTRACT

An ultrafast magnetic resonance imaging (MRI) system configured to acquire MR signals from a multi-slice volume that is in a steady main magnetic field $B_0$ along a z-direction of a Cartesian xyz coordinate system, using spatial sensitivity parameters of small receiver coils arranged in rings around the volume, using a magnetic field gradient $g_z$ along the z-direction, that can be switched on and off and a magnetic field gradient $g_x$ that is in the x-direction and that can be switched on and off. MRI signals from a slice relate to the slice position along z, and an excitation 90° pulse and a refocusing 180° pulse, signals for voxels in a y-direction column in a slice relate to position of the column in the $g_x$ field, and signals for voxels within a column relate to the xy positions of the plurality of coils.

3 Claims, 1 Drawing Sheet

ULTRAFAST MRI SYSTEM AND METHOD

REFERENCE TO RELATED APPLICATIONS

This application claims priority to and incorporates by reference provisional application 63/434,790 filed Dec. 22, 2022. This application incorporates by reference each of U.S. Pat. Nos. 10,107,883 B2, 10,877,122 B2, and 11,385,312 B2 as well as the references cited in said patents. In addition, references 1-3 cited at the end of the Detailed Description are hereby incorporated by reference.

FIELD

This patent specification relates to MRI systems and methods and specifically to providing additional avenues for implementing ultrafast MRI, which may be more tractable mathematically than those disclosed in the three patents incorporated by reference above and provide better imaging of fine detail.

BACKGROUND

The three patents incorporated by reference describe a massively parallel, ultrafast MRI system named ULTRA and compare it with prior known MRI systems in some respects. The three patents describe how a 3-dimensional MR image can be encoded by a radiofrequency (RF) pulse using spatial sensitivity encoding to obtain a 3-D MR image in milliseconds. As described in detail in the three patents, a set of M circular detector rings are arrayed parallel to one another, each ring having N small detector loops equally spaced around its perimeter. The detector rings can be each of radius R and equally spaced along the z axis, with the center of each ring on the z axis. The rings therefore form a cylinder with axis z. This cylinder lies within, and is concentric with, the main MRI coil which produces the large imposed magnetic field $B_0$. A fixed magnetic field gradient is applied along the z axis ($g_z$). A 90° RF pulse is then used to excite all the spins within the 3-D volume to be imaged, and these spins are refocused by 180° RF pulses, each of which can encode the entire 3-D volume. Through the changes in voxel-based signal over time, a T1-weighted image and a T2-weighted image can be computed. Therefore, a spin density image may be obtained in a few milliseconds, and a set of clinical images (spin density, T1 and T2-weighted images) may be obtained in a few hundred milliseconds. The important FLAIR image would then be separately obtained after waiting a few seconds for all spins in the volume to relax, followed by re-excitation. Therefore, an entire set of clinical images can be obtained in under 5 seconds. Using MRI technology as currently used clinically, the time taken for the same task is typically 10-15 minutes, meaning that ULTRA is at least two orders or magnitude faster than existing clinical techniques. This could have enormous implications for cardiac imaging, as well as imaging of other structures of the thorax and abdomen.

While this approach remains feasible, the technique can be modified, as described below with respect to at least two possible challenges: (1) restrictions on bandwidth for encoding a large amount of 3-D information into a single RF echo; and (2) a need to compute the inverse of a large spatial sensitivity matrix (SSM) which for technical reasons may not be well-conditioned.

SUMMARY OF DISCLOSURE

The ULTRA system described in the three patents can be significantly modified by acquiring images of planes, in sequential fashion—or simultaneously—using two magnetic field gradients, one along the z axis, $g_z$, as in the three patents, but in addition, a gradient, $g_x$, applied along the x axis perpendicular to z. The gradient $g_x$ simultaneously encodes all spins in each xy slice (hereafter referred to as the "slice"), with frequencies that depend only on their y location, that is, the encoded slice divides into N columns parallel to y, with a fixed frequency for each value of y. This distinguishes it from conventional spin echo, since an entire slice in a 2D Cartesian space is encoded, instead of a single line in k-space. This has important ramifications since, although the detectors are much smaller than in conventional fast imaging, nevertheless signal is maintained despite a large increase in speed (see below).

Examples of embodiments are described in the Detailed Description and the appended initially presented claims, which claims are subject to amendments thereof in prosecuting this patent application.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The subject matter hereof will be described and explained with additional specificity and detail through the accompanying drawings in which:

FIG. 1a schematically illustrates an MRI system and an imaging volume, according to some embodiments.

FIG. 1b illustrates a Cartesian coordinate system related to the MRI system.

FIG. 1c schematically illustrates image acquisition and processing system.

FIG. 1d is a perspective schematic view of a portion of a magnet and coils of the system of FIG. 1a.

FIG. 1e schematically illustrates multiple rings of coil detectors.

DETAILED DESCRIPTION

Figure 1A:
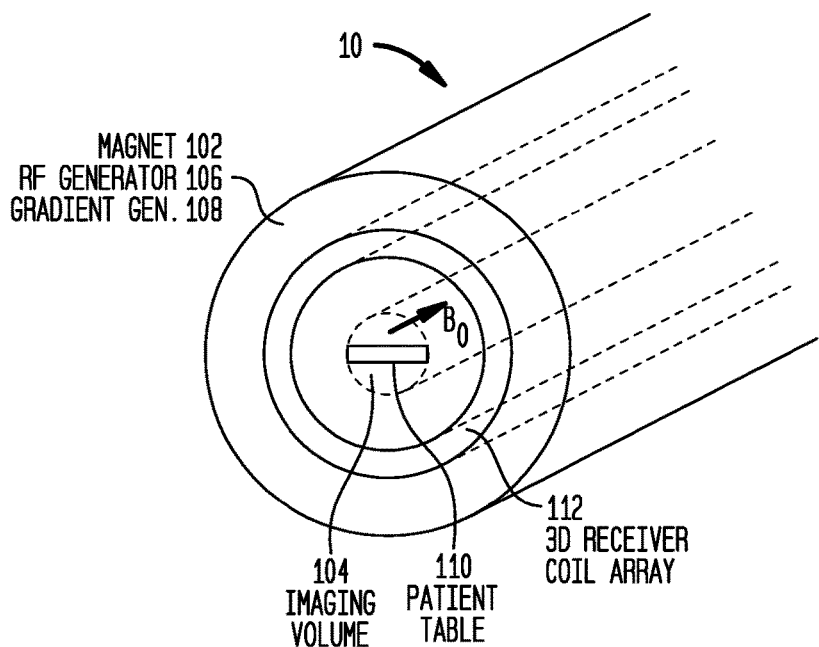
FIGS. 1a-1e are otherwise like those in U.S. Pat. No. 11,385,312, incorporated by reference, but gradient generator 108 in this case is configured to generate a gradient field in the x direction in addition to a gradient field in the z direction.

A detailed description of examples of preferred embodiments is provided below. While several embodiments are described, the new subject matter described in this patent specification is not limited to any one embodiment or combination of embodiments described herein, but instead encompasses numerous alternatives, modifications, and equivalents. In addition, while numerous specific details are set forth in the following description to provide a thorough understanding, some embodiments can be practiced without some or all these details. Moreover, for the purpose of clarity, certain technical material that is known in the related art has not been described in detail to avoid unnecessarily obscuring the new subject matter described herein. It should be clear that individual features of one or several of the specific embodiments described herein can be used in combination with features of other described embodiments or with other features. Further, like reference numbers and designations in the various drawings indicate like elements.

A first example of the new approach is where the M rings are excited successively. M is the number of rings and thus slices, for example 10, 20, 30, or more. In this way, and according to Eq. (1) in the three patents, after the last slice has been excited and re-focused, there are now multiple planes of M×N data which together comprise the volumetric image. N is the number of small detector loops or coils in a ring.

Instead of being fixed, as in the three patents, the z gradient becomes the effective "slice select" gradient. With $g_z$ switched on, a 90° RF pulse is applied to selectively excite all spins in a particular selected slice in the multi-slice imaging volume. The RF pulse and $g_z$ are then switched off.

Subsequently, the $g_x$ gradient is switched on, in order to spatially encode N columns of spins within the selected slice slice, each column comprised of spins of the same frequency, with each frequency different from the frequencies in all other N−1 columns of the selected slice. The gradient $g_x$ is then switched off, and subsequently $g_z$ is switched on and a 180° RF pulse is applied, which refocuses all the spins in the selected slice to form an echo; $g_z$ is then switched off. A signal from this echo is generated in each of the N detector loops surrounding the selected slice. These N signals are all slightly different, depending on the x-y location of a given detector loop. Each of the N signals then undergoes a one-dimensional Fourier transform. This transformed signal is the total amplitude of the echo, as a function of frequency ω, in each of the N detector loops. Since w is associated with a particular y column of the slice, the total amplitude, at the given frequency $\omega_y$, in a particular detector α, is the sum of all N voxels in the corresponding y column. This amplitude, in turn, is proportional to the sum of spin densities for each voxel in the y column. The geometric factor $F_\alpha(x,y)$ is the amplitude at detector α of a source of unit amplitude at position (x,y) within the slice. This depends on the distance r from the given voxel to a given detector, and is generally taken as $r^{-3}$, where r is the distance between the voxel (x,y) and the detector $\alpha$.[1,2] By inverting F, the set of N spin densities in each y column can be calculated.[1,2] Since each slice of the object is encoded by a single echo, the entire 3D volume can be imaged in tens of milliseconds.

After the last excitation, there is a repeat of the procedure, starting with a 180° RF pulse for the first slice, etc. These re-excitations are subject to T1 and T2 decay, so that volumetric maps of spin density, T1 and T2 can be constructed after a few hundred milliseconds. Since slice excitation is sequential, this approach is slower than in the 3 patents, although the rate of signal acquisition remains higher than current fast imaging methods, e.g., SMASH-EPI and SENSE-EPI.[3] In every other respect it retains the advantages of the 3 patents over SENSE-EPI, and, in addition, is less complicated than the 3 patents.

Moreover, known existing technology is restricted to T2*-weighted images, and therefore has limited value for clinical imaging. Such techniques remain useful, however, for functional MRI and for susceptibility-weighted imaging. The technique outlined here is not only faster than existing technology, but also has full clinical applicability and unexpectedly better imaging of fine detail.

This first example differs from known prior art (e.g., EPI-SENSE, see reference 3 cited at the end of the Detailed Description) at least in that (i) RF pulses, rather than gradient reversals are used to refocus the echoes, providing the possibility of obtaining T1 and T2-weighted images rather than just T2*-weighted images; (ii) since each echo codes for an entire slice of data, rather than a line of data, it is very much faster than known existing methods, with a significantly higher rate of acquisition of signal; and (iii) there is almost no susceptibility artifact.

This first example differs from the ULTRA system described in the 3 patents at least by the introduction of a second gradient, $g_x$, for simplifying and improving the encoding of the 3-D volumetric image. It differs from references 1 and 2 cited at the end of the Detailed Description at least by the introduction of a second gradient, $g_z$, and by (ii) the introduction of multiple rings of receiver coils in the service of obtaining a 3-D volumetric image. References 1 and 2 suggested that spatial sensitivity encoding was feasible but did not show how to construct a 3-D volumetric image.

Figure 1B:
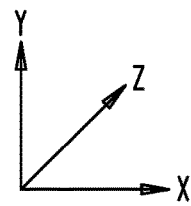
Figure 1C:
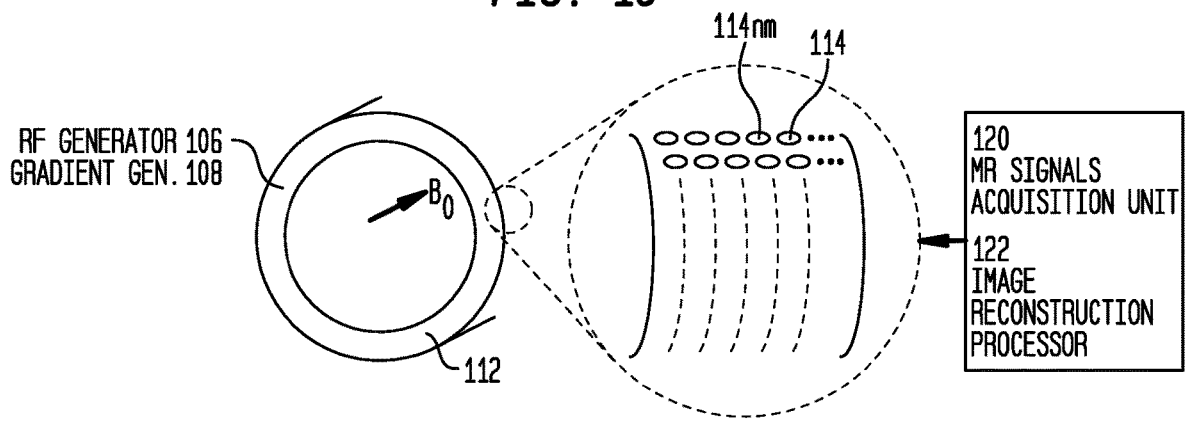
Figure 1D:
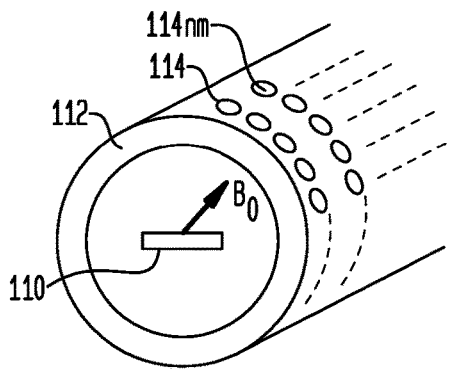
Figure 1E:
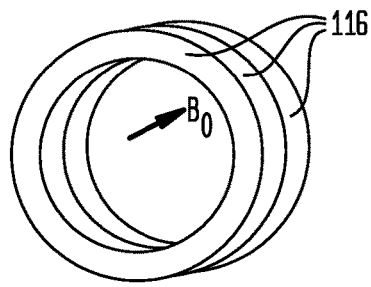

FIGS. 1a-1e are otherwise like in U.S. Pat. No. 11,385, 312, incorporated by reference, except that a significant addition used in the new approach described in this patent specification, is that gradient generator 108 is configured to generate gradient $g_x$ in addition to gradient $g_z$. Receiver or detector coil loops or coils 114 are as described above rather than as in said patent, and units 120, 122, and 123 operate as described above for signal acquisition and image reconstruction except that MR signals are acquired as described above and supplied for processing accordingly.

Unexpectedly, using the $g_x$ gradient and the repetitions as described above significantly improves imaging fine detail compared to the three patents identified above. The reasons may not be entirely understood but may have to do with increases bandwidth in the MS signal acquisition process and possibly less interaction between concurrently acting multitudes of small receiver coils.

A second example of the new approach is a set of M rings, as described above, with N detector loops equally spaced around the perimeter of a ring. The loops are tuned so that they can only respond to (or be resonant with) a narrow bandwidth of radio frequencies defined by $B_0$ and by the local magnetic fields defined by $g_z$. With $g_z$ switched on, a broad bandwidth 90° RF pulse excites all the spins in the entire multi-slice volume. The gradient $g_z$ is then switched off, and $g_x$ is switched on, and then off, to spatially encode all spins, as in the first example but in this case in all slices. Then a broad band of 180° RF pulse is used to form an echo for spins in every slice of the volume. Since a given RF pulse is resonant only with a particular ring, none of the adjacent rings can significantly contribute to the signal, and therefore an image of each slice can be constructed from the signal detected only by those detectors which surround the slice of interest. Since all slices are excited simultaneously, this example is similar in result, though not in how the result is achieved, to what was described in the previous 3 patents, i.e., a 3D volume image acquired in milliseconds. As with the first example, there is an unexpected improvement in imaging fine detail in the imaging volume.

This second example differs from the ULTRA system described in the three patents at least by the introduction of (i) a second gradient, $g_x$, for simplifying the encoding of the 3-D volumetric image, and (ii) by the decoupling of the detector rings from each other, which may be a part of the reason for achieving the unexpectedly improved imaging of fine detail.

It also differs from the first example by the introduction of decoupling between the detector rings in the service of simultaneous acquisition of a volumetric image by means of simultaneously formed echoes.

This second example also differs from references 1 and 2 cited at the end of the Detailed Description at least by (i) the introduction of a second gradient, $g_z$, in the service of obtaining a 3-D volumetric image, and (ii) the introduction of multiple rings of receiver coils.

A third example is like the first, except that it employs a single detector ring, or a small number of, detector rings (for example 2, 3, 5, or 10 or more), rather than a complete set of many parallel rings. This single ring, or small subset of rings, is translated along the z axis, with a set of sequential tailored RF pulses timed to excite only the local slice(s) briefly surrounded by the detector ring(s) moving in a trajectory along z. This has the advantage of great simplicity, but a potential challenge is the possible generation of Faraday currents in the detector loops, so that for a more practical embodiment the ring may move quickly in a start-and-stop fashion, with each successive excitation obtained while stopped at a particular location along the z axis.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

REFERENCES

1. Hutchinson M and Raff U, Sub-second MRI Data Acquisition Using Multiple Detectors, Proceedings of the Society for Magnetic Resonance in Medicine, 6th Annual Meeting, Aug. 17 1987, New York. Volume 1987, Issue Supplement S1, p. 459.
2. Hutchinson M and Raff U, Fast MRI data acquisition using multiple detectors, Mag. Res. Med. 1988; 6:87-91.
3. Larkman D J, Hajnal J V, Herlihy A H, Coutts G A, Young I R, Enholm G, Use of multicoil arrays for separation of signal for multiple slices simultaneously excited. J. Magn. Reson. Imaging, 2001; 13:313-317.

What it claimed is:

1. A magnetic resonance imaging (MRI) system configured to acquire MR signals from a multi-slice volume (104) that is in a steady main magnetic field $B_0$ along a z-direction of a Cartesian xyz coordinate system, using spatial sensitivity parameters of small, tuned receiver coils (114), comprising:
   a gradient magnetic field generator (108) configured to apply to said volume (104) a gradient field $g_z$ along the z-direction and a gradient field $g_x$ along the x-direction, these gradients being successively applied to select respective xy slices in a time succession, and to spatially encode columns of voxels within each slice in said time succession;
   a radio frequency (RF) pulse generator (106) configured to apply to the volume a time succession of narrow bandwidth 90° RF excitation pulses each tailored to excite a respective slice and each followed by a respective 180° refocusing RF pulse that is tailored to the respective slice to thereby form echoes for spins in the respective slices;
   plural rings (114) that surround the volume and are adjacent in the z-direction to form a cylinder, each ring comprising a multitude of said small receiver coils arranged along the circumference of the ring and each having respective xy coordinates;
   wherein said coils are configured to acquire echo MR signals from the volume such that signals for a slice are related to slice position relative to said gradient field $g_z$, signals for respective columns of voxels in the slice are related to column position relative to said gradient field $g_x$, and signals for voxel positions in a column are related to xy positions of the coils; and
   an image reconstruction facility (120, 122) configured to receive the MR signals and reconstruct slice images.

2. A magnetic resonance imaging (MRI) system configured to acquire MR signals from a multi-slice volume that is in a steady main magnetic field $B_0$ along a z-direction of a Cartesian xyz coordinate system, using spatial sensitivity parameters of small, tuned receiver coils, comprising:
   a gradient magnetic field generator configured to apply to said volume a gradient field $g_z$ along the z-direction and a gradient field $g_x$ that is in the x-direction;
   a radio frequency (RF) pulse generator configured to apply to the volume a broad bandwidth 90° RF excitation pulse that has a sufficiently broad bandwidth to excite the slices in the volume and later a 180° refocusing RF pulse that has a sufficiently broad bandwidth to form echoes for spins in said slices;
   plural rings that surround the volume and are adjacent in the z-direction to form a cylinder, each ring comprising a multitude of said small receiver coils arranged along the circumference of the ring and each having respective xy coordinates, with the coils of each ring tuned to the local resonance frequency defined by $g_z$ and $g_x$;
   wherein said coils of each ring are configured to acquire echo MR signals only from a respective slice such that signals for respective slice are related to slice position relative to said gradient field $g_z$, signals for respective columns of voxels in the slice are related to column position relative to said gradient field $g_x$, and signals for respective voxel positions in a column are related to xy positions of the coils; and
   an image reconstruction facility configured to receive the MR signals and reconstruct slice images.

3. A magnetic resonance imaging (MRI) system configured to acquire MR signals from a multi-slice volume that is in a steady main magnetic field $B_0$ along a z-direction of a Cartesian xyz coordinate system, using spatial sensitivity parameters of small, tuned receiver coils, comprising:
   a gradient magnetic field generator configured to apply to said volume a gradient field $g_z$ along the z-direction and a gradient field $g_x$ that is in the x-direction;
   a radio frequency (RF) pulse generator configured to apply to the volume one or more narrow bandwidth 90° RF excitation pulses each tailored to excite a respective slice and each followed by a respective 180° refocusing RF pulse that is tailored to the slice to thereby form echoes for spins in the respective slices;
   one or more rings that surround the volume, each ring comprising a multitude of said small receiver coils arranged along the circumference of the ring and each having respective xy coordinates, with the coils of each ring configured to receive spin echoes from a respective slice;
   wherein said one or more rings are configured to translate along the z direction relative to the volume;
   wherein said coils are configured to acquire echo MR signals from the volume such that signals for a slice are related to a current position of said one or more rings relative to the volume, signals for respective columns of voxels in a slice are related to column position relative to said gradient field $g_x$, and voxel positions in a column are related to xy positions of the coils; and
an image reconstruction facility configured to receive the MR signals and reconstruct slice images.

* * * * *